(12) United States Patent
Criscione

(10) Patent No.: US 6,359,497 B1
(45) Date of Patent: Mar. 19, 2002

(54) AUTOMATIC LOCKUP LOW-VOLTAGE BIASING CIRCUIT

(75) Inventor: Marcello Criscione, Ragusa (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/552,934

(22) Filed: Apr. 20, 2000

(30) Foreign Application Priority Data

Apr. 21, 1999 (EP) .............................. 99830233

(51) Int. Cl.[7] .............................................. H03K 17/62
(52) U.S. Cl. .............................. 327/408; 327/63; 327/65
(58) Field of Search .................................. 327/407, 408, 327/205, 58, 62, 63, 65, 66, 67, 71, 530, 534, 535, 538, 540, 541, 543

(56) References Cited

U.S. PATENT DOCUMENTS

| | | | |
|---|---|---|---|
| 5,187,396 A | * | 2/1993 | Armstrong, II et al. ...... 327/65 |
| 5,272,393 A | | 12/1993 | Horiguchi et al. ........ 307/296.6 |
| 6,040,718 A | * | 3/2000 | Henry .......................... 327/71 |

FOREIGN PATENT DOCUMENTS

| | | |
|---|---|---|
| EP | 0287863 A2 | 10/1988 |
| EP | 0442688 A2 | 8/1991 |
| WO | WO 90/12324 | 10/1990 |

\* cited by examiner

*Primary Examiner*—Tuan T. Lam
*Assistant Examiner*—Hiep Nguyen
(74) *Attorney, Agent, or Firm*—Lisa Jorgenson; Robert Iannucci; Seed IP Law Group, PLLC

(57) ABSTRACT

Presented is a low-voltage automatic lock-up biasing circuit with input terminals that accept input voltages, and with an internal node coupled to both input terminals an which takes take the highest of the voltage values applied to the input terminals. This circuit uses a comparator having respective inputs connected to the input terminals and with an output connected to a level shifter. Outputs of the level shifter are coupled to respective enable elements connected between each input terminal and the internal node. The enable elements are driven each by a respective output of the level shifter.

14 Claims, 5 Drawing Sheets

AUTOMATIC LOCKUP LOW-VOLTAGE BIASING CIRCUIT

TECHNICAL FIELD

This invention relates to an automatic lockup low-voltage biasing circuit having first and second input terminals, to which respective voltage values are applied, and an internal node coupled to both input terminals to pick up the highest voltage value from those applied to the input terminals.

BACKGROUND OF THE INVENTION

There are several fields of application where a need currently exists for integrated electronic circuits with bootstrap architectures, that is, capable of locking an internal supply, potential of an integrated circuit to a supply voltage reference at a higher potential.

This need is felt especially in those application fields where an improved efficiency of CMOS circuits is sought, for which circuits a higher gate terminal drive voltage allows the performance of power switches to be improved or stable bandgap voltage references to be provided even where the supply is insufficient for proper biasing.

In this context, it is known to provide biasing circuits with bootstrap characteristics, and the main types of such circuits will be reviewed herein below.

The features that a biasing circuit should exhibit in order to meet the above requirements will now be discussed.

A biasing circuit should be capable of locking the potential at a node VH to the higher of two distinct voltage references V1, V2 available, namely:

$$VH = max(V1, V2).$$

A biasing circuit should be capable of correctly locking the potential VH even in extreme conditions, namely:

$$V1 > Vgs, V2 = 0 \quad \quad 1)$$

$$V2 > Vgs, V1 = 0. \quad \quad 2)$$

In addition, such a circuit should have minimal static consumption.

Further important features are a capability to lock up the node VH continuously, without uncertainty or promoting cross-conduction between the sources V1, V2. Furthermore, it is desired that the circuit can be operated at very low supply voltages, e.g., on the order of 0.7V.

Finally, a biasing circuit should exhibit a minimal voltage drop across its pass elements.

A first type of a circuit according to the prior art comprises first D1 and second D2 diodes respectively connected between supply voltage references V1, V2 and a common node VH. The diodes are formed by bipolar transistors having respective base-emitter Vbe and collector-emitter Vce voltage drops.

It is the provision of the diodes that restricts the applicability of this approach, because the voltage drop across each diode only allows the following potential to be attained:

VH=max(V1, V2)−Vbeon, where Vbeon is equal to the base-emitter voltage drop at the turned-on diode.

Accordingly, such a biasing circuit would only make sense at higher voltages than $$max(V1,V2) > 2*Vbe+Vce.$$

A second known solution is described in PCT application No. WO 90/06012, which relates to an integrated circuit protected against reversal of the supply battery potential. This integrated circuit comprises a biasing circuit that only operates correctly when $$V1-V2 > (Vbe+R*Ib).$$

This circuit has fairly high static consumption which is dependent on the load applied to the node VH [referred to as I(V_HIGH) in the patent specification] according to relation Ibias=VH/β.

A third known solution is described in U.S. Pat. No. 5,159,207, concerning a circuit for dynamic isolation of integrated circuits.

The object of such a circuit is to provide a substrate bias in integrated circuits where the voltage Vout can drop below ground potential (GND). In particular, a bipolar transistor of the substrate vertical NPN type can lock up the substrate potential in accord with the following relation:

$$Viso=min(Vout, Vgnd)+Vcesat.$$

The drop of potential, Vcesat, is approximately 200 mV. However, the circuit also exhibits static consumption when a current flows through the substrate. In particular, the static consumption is dependent on the substrate current according to relation Ibias=Iiso/β.

There are other biasing circuits available commercially which have self-bootstrapping features. For example, certain switching regulators from Analog Device can implement highly efficient internal bootstrap architectures.

While being in several ways advantageous, the operation of such regulators is very much restricted by that, in the following conditions:

$$Vout-Vin > Vbeon \text{ and } Vin=0,$$

the current draw by the device is high. In addition, if the difference between the input and output voltages is brought to 1V in value, irreversible damage is caused to the regulator.

These and other prior art solutions, although providing biasing circuits of good efficiency, have certain limitations and deficiencies, including a relatively high static consumption, the effects of cross-conduction phenomena, and an inability to operate on very low supply voltages.

SUMMARY OF THE INVENTION

Embodiments of this invention provide an automatic lock-up biasing circuit having a bootstrap architecture which can afford minimal static consumption and allow operation even on very low supply voltages.

These embodiments use a maximum voltage comparator having reference voltage values applied to input terminals, and has an output connected to a level shifter adapted to generate drive signals to respective enable elements that are connected between the reference voltages and an internal potential lock-up node. Also presented is a step DC/DC converter that uses at least one of the described biasing circuits.

The features and advantages of a circuit according to this invention can be more clearly understood by reading the following detailed description of practical embodiments thereof, as illustrated by way of non-limitative examples in the accompanying drawings.

DETAILED DESCRIPTION OF THE INVENTION

Figure 1:
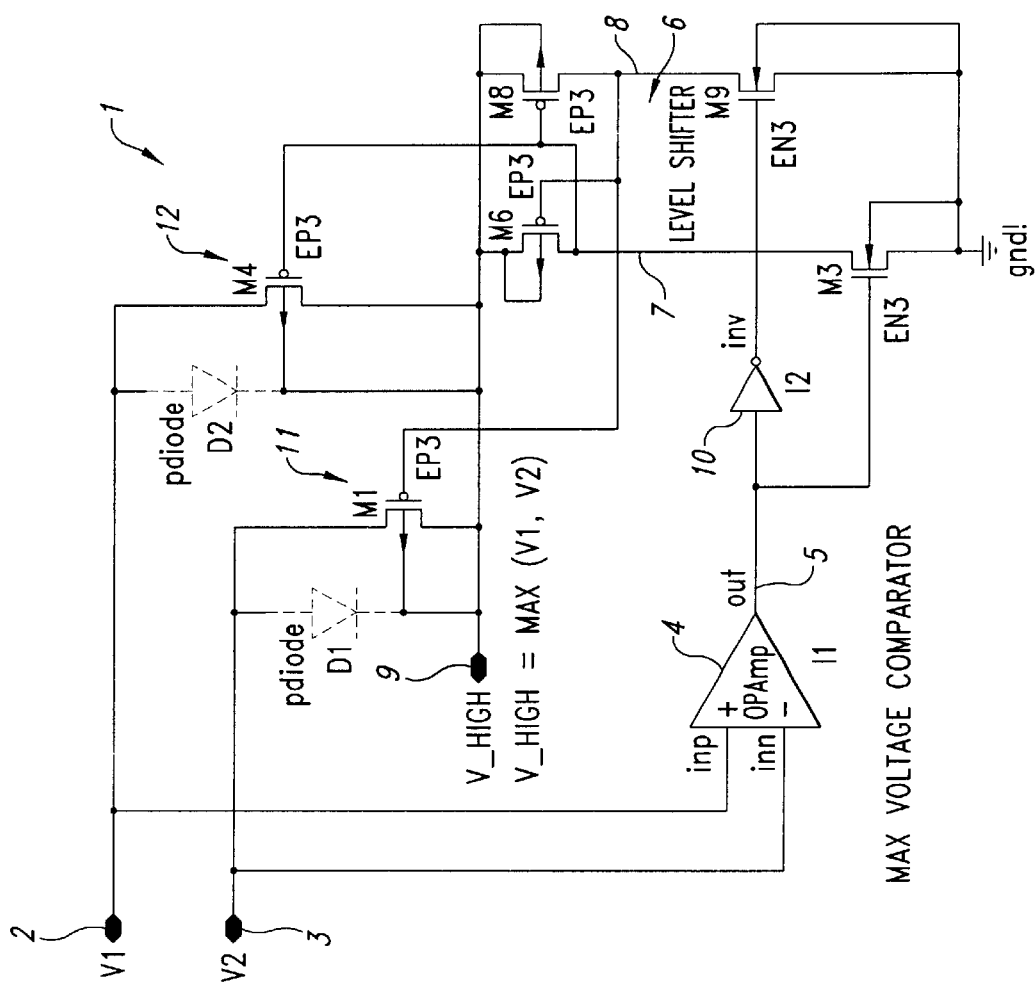
FIG. 1 is a schematic diagram of an automatic lock-up biasing circuit according to an embodiment of this invention.

Referring to the drawing views, shown generally and schematically at 1 is a biasing circuit according to an embodiment of this invention.

The circuit 1 has a first input terminal 2 which is applied a first supply voltage reference V1, and has a second input terminal 3 which is applied a second supply voltage reference V2.

The circuit 1 an output terminal 9 substantially coincident with a node V_HIGH.

The input terminal 2 is connected to a non-inverting (+) input of a maximum voltage comparator 4. The input terminal 3 is connected to an inverting (−) terminal of the comparator 4.

This comparator 4 is responsible for comparing the input voltages V1 and V2, and for generating a logic signal at a node 5.

The circuit 1 includes a CMOS double inverter 6 which also functions as a level shifter.

The double inverter 6 includes a first complementary transistor pair 7 formed of a transistor M6 of the PMOS type and a transistor M3 of the NMOS type. This first transistor pair 7 is connected between the node V_HIGH 9 and a voltage reference GND such as a signal ground.

A second complementary pair 8 is formed of a transistor M8 of the PMOS type and a transistor M9 of the NMOS type. This second pair 8 is also connected between the node V_HIGH 9 and the voltage reference GND.

Conveniently, the aspect ratios W/L of the NMOS transistors M3 and M9 are selected to be much higher than the corresponding W/L ratios of the PMOS transistors M6 and M8.

The body terminals of the transistors M3 and M9 are connected to the ground reference GND. The body terminals of the transistors M6 and M8 are connected to the node V_HIGH 9.

The output 5 of the comparator 4 is connected directly to a control terminal of the NMOS transistor M3 in the first complementary pair 7.

This output 5 is also connected to a control terminal of the NMOS transistor M9 in the second complementary pair 8 via a CMOS inverter 10.

The circuit 1 further includes two enable elements 11, 12. Enable element 11 is connected between the input 3 and the node V_HIGH 9, while the enable element 12 is connected between the input 2 and the node V_HIGH 9.

These elements 11, 12 are implemented by respective pass transistors M1, M4 of the PMOS type which have conduction terminals respectively connected between an nput terminal and the node V_HIGH 9.

Transistor M1 has a control terminal connected to the control terminal of transistor M6 in the complementary pair 7, as well as to a drain terminal of transistor M8 in the other complementary pair 8.

Transistor M4 has a control terminal connected to the control terminal of transistor M8 in the complementary pair 8, as well as to a drain terminal of transistor M6 in the other complementary pair 7.

Advantageously, a body terminal of transistor M1 is connected directly to the node V_HIGH 9, and indirectly coupled to the input terminal 3 through a parasitic component, specifically through a CMOS well diode D1. Thus, the diode D1 is forward biased to the drain terminal of transistor M1.

In addition, a body terminal of transistor M4 is connected directly to the node V_HIGH 9, and indirectly coupled to the input terminal 2 through a parasitic component, specifically through a CMOS well diode D2. Thus, the diode D2 is forward biased to the drain terminal of transistor M4.

The diodes D1, D2 are connected together into a back-to-back configuration, which has an advantage in that it prevents incidental conduction from occurring between the lines V1, V2.

The operation of the biasing circuit 1 according to this embodiment of the invention will now be described.

The comparator 4 is responsible for comparing the potentials of voltages V1 and V2, and generates at an output node 5 a logic signal provided to the level shifter 6. The latter is responsible for generating the drive signals to the control terminals of the PMOS transistors M1 and M4, bringing such signals to a level at which the said pass transistors are positively turned off whenever they are to be blocked.

The peculiar construction of the shifter 6 allows phase-opposition signals to be always generated which never attain the same level simultaneously. In this way, the occurrence of a condition where the pass transistors M1, M4 are turned on simultaneously can be effectively prevented. Consequently, dangerous cross-conduction situations are avoided which could have destructive effects if a large difference in potential of the two voltages V1, V2 existed.

By having the CMOS wells connected to the drain terminals of the transistors M1, M4, to form the parasitic diodes D1, D2, these parasitic junctions can be utilized as pull-up elements at start-up of the circuit 1. In this way, the steady-state condition can be attained in less time; in fact, with both PMOS transistors M1, M4 still off, the potential at the node V_HIGH 9 will attain at all events a value given as:

$$V\_HIGH = \max(V1, V2) - Vbeon.$$

Since upon start-up virtually no current is flowing through the node V_HIGH 9, a voltage Vbeon in the above relation will be of a very small value, and the voltage V_HIGH 9 attained will be a sufficient level to initiate operation of the level shifter 6 and turn on the selected pass transistor M1 or M4 according to condition max(V1,V2).

Assume an initial state where the potential of voltage V1 is higher than that of voltage V2.

In this condition, the signal at the output 5 of the comparator 4 will be high, and be the same as the supply voltage to the comparator itself.

The output of the CMOS inverter 10 goes to a logic low (0V).

With these signal values, the states of the transistors in the double inverter-shifter 6 are as follows: M3 on; M6 off; M8 on; and M9 off, Since a higher aspect ratio W/L is used for the NMOS transistors than for the PMOS transistors, it follows that:

$$Vg(M4) = 0V; \quad Vg(M1) = V\_HIGH.$$

Consequently, transistor M4 will be on while transistor M1 is off.

The value of potential V_HIGH takes therefore the largest of the values available at the input, i.e., V_HIGH=max(V1,V2)=V1.

The potential V_HIGH differs from V1 only by a very small value equal to Vds(sat) of the PMOS pass transistors.

The static consumption of the circuit 1 according to this embodiment of the invention only equals the amount of current required to operate the comparator 4, with a small hysteresis added to avoid uncertainty of decision when the values of the potentials V1 and V2 lie (lose to each other.

The instance of V2>V1 will now be briefly considered.

Tn this condition, transistor M4 will be off at the same time as transistor M1 is on. Therefore, V_HIGH=max(V1, V2)=V2.

The circuit 1 of the invention also operates effectively in the following conditions:

V1=0V and V2>Vgs, or

V2=0V and V1>Vgs, which conditions have proved to be destructive to prior art biasing circuits.

Figure 2:
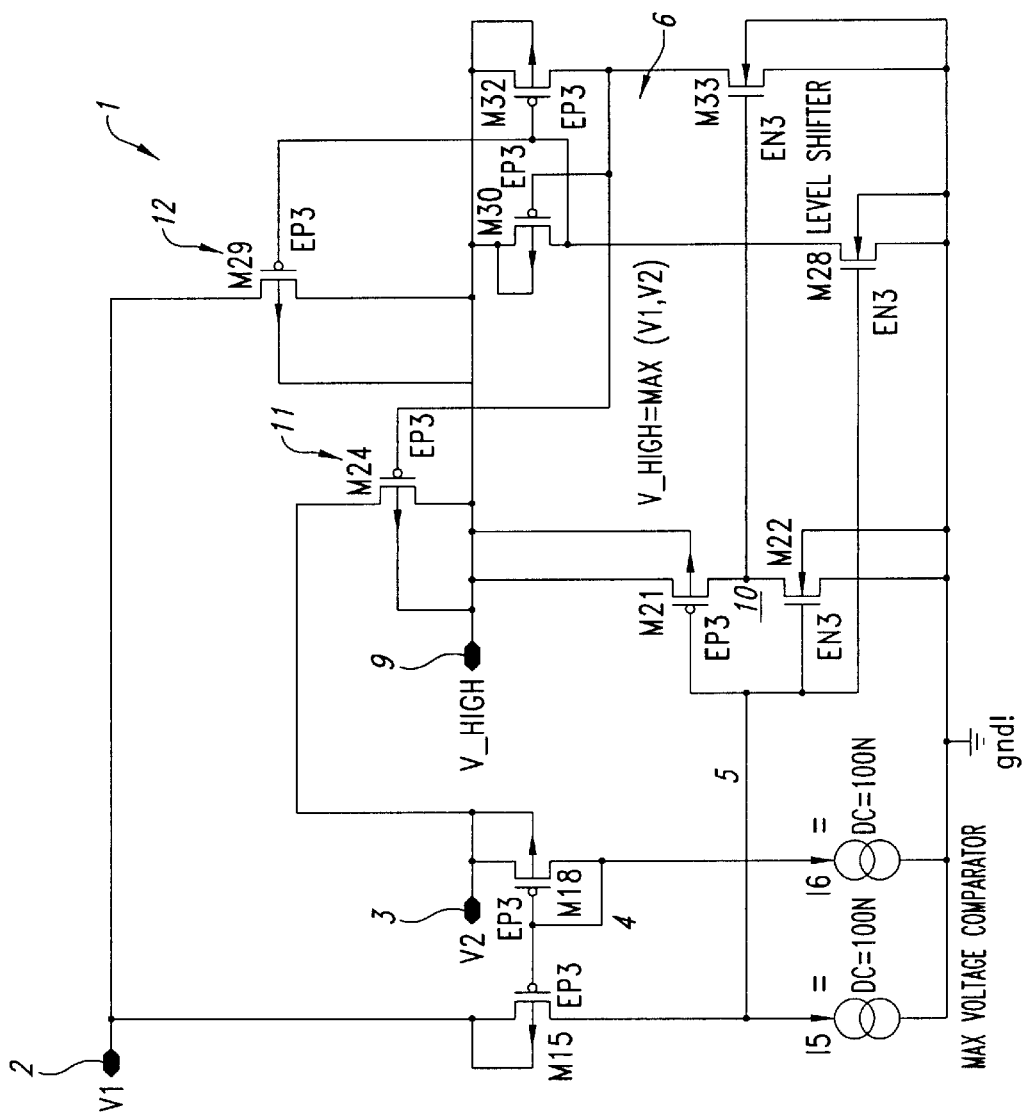
FIG. 2 is a schematic diagram showing the circuit in FIG. 1 in further detail.

Shown in FIG. 2 is a more detailed circuit diagram illustrating that the comparator 4 can be formed of a differential cell comprising a pair of transistors M15, M18 of the PMOS type which make up the bias portion for the current mirrors 15 and 16.

FIG. 2 also shows a complementary pair of transistors M21 and M22 comprising the inverter 10.

Figure 3A:
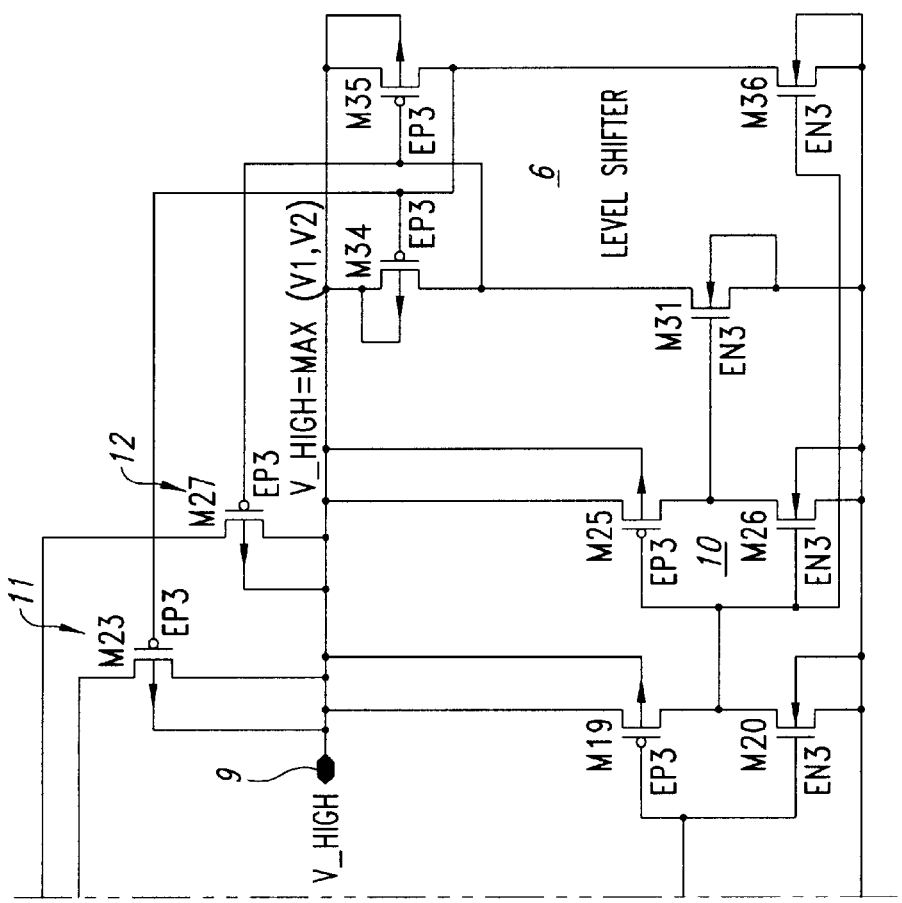
FIG. 3 is a schematic diagram illustrating the embodiment of FIG. 1 in further detail.
Figure 3B:
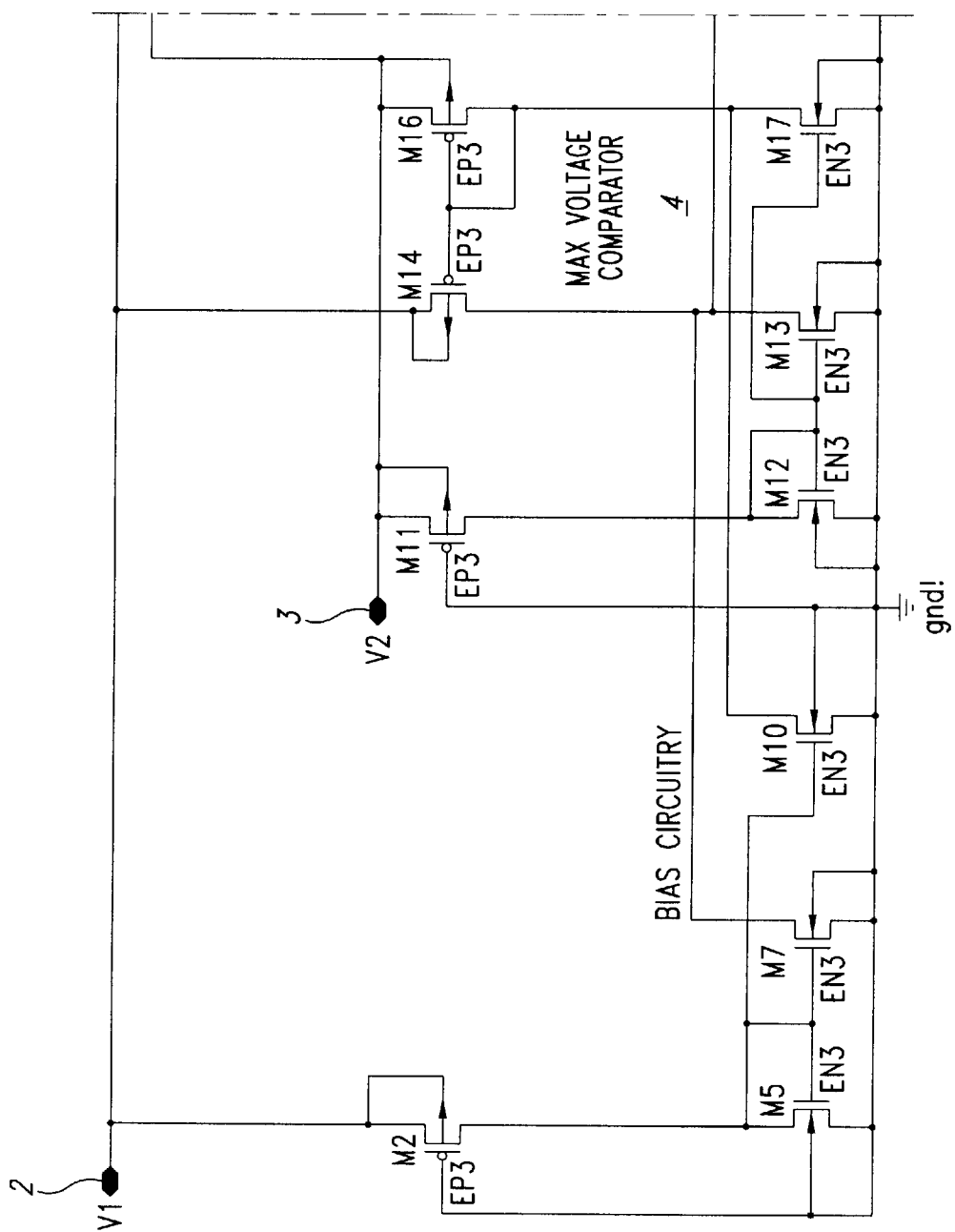

FIG. 3 shows in even greater detail the biasing circuit of the invention.

Transistors M2 and M11 are resistive PMOSs having a W/L ratio <<1, and supply a set of current mirrors M5, M7; M10, M12; M13, M17 with the required currents to operate the comparator 4.

The split bias circuitry of the comparator 4 is intended to ensure full operability of th, circuit even in extremely critical conditions, as would be created for instance by:

V1=0, V2>Vgs, or V2=0, V1>Vgs.

The overall current consumption from V1 and V2 can be kept as low as 200 nA by appropriate sizing of transistors M2 and M11, without impairing the functionality of the circuit, which would operate properly even without such specific sizing.

Figure 4A:
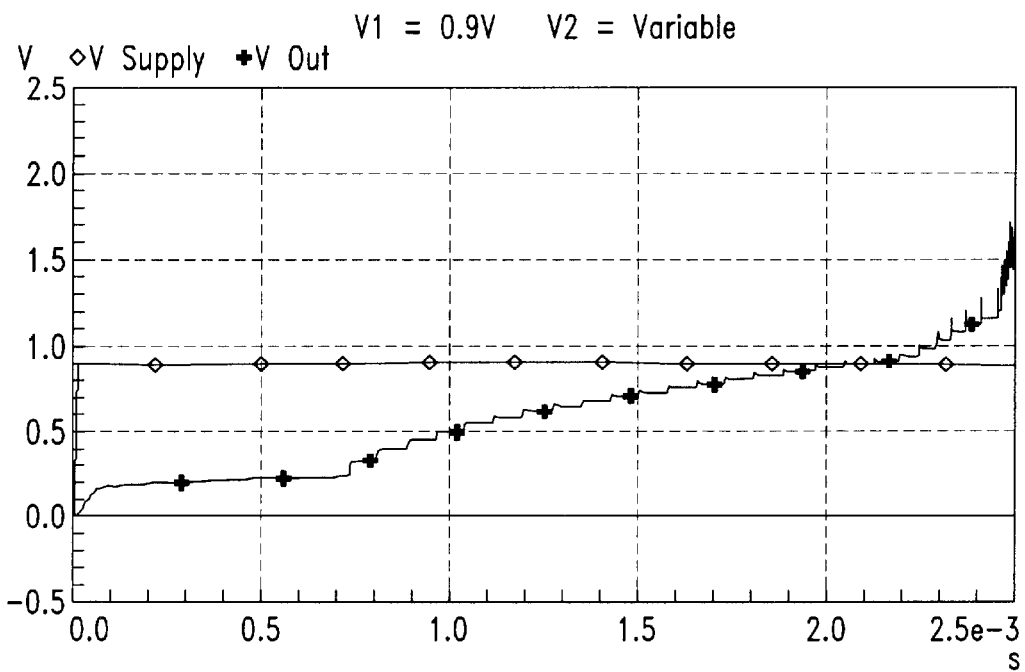
FIGS. 4A and 4B are respective graphs of voltage vs. time for bias signals appearing in the tested embodiments of the invention.
Figure 4B:
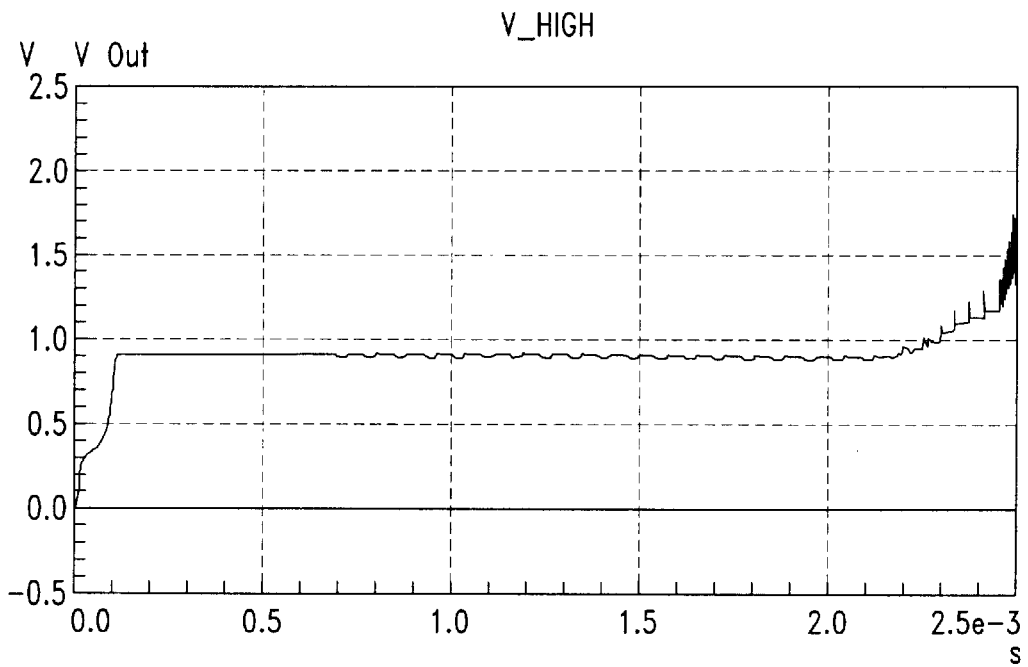

The circuit 1 of this embodiment is adapted for use in low-voltage step-up DC/DC converting circuits. By comparison, FIGS. 4A and 4B show plottings of voltage vs. time for the supply voltage signal to the circuit 1 at start-up.

This supply voltage has a value of 0.9V at start-up and is exceeded by the output voltage of the converter after a charge transient of the output capacitance. The supply V_HIGH to the regulator internal circuits is switched between Vin=0.9V and Vout=5V (FIG. 4B), which is highly beneficial in terms of efficiency and electrical performance.

Finally, it should be noted that the maximum working voltage at which the circuit 1 can be operated is tied to the specific CMOS technology employed, and is coincident with the least of the maximum voltages that can be applied to the CMOS components used, i.e.:

V1max=V2max<min[V(PMOS)max, V(NMS)max].

This circuit 1 affords a number of advantages over the prior art, among which the fact is outstanding that the current consumption of the circuit is now independent of the load being applied to the node V_HIGH.

Furthermore, the drop-out between the value max(V1,V2) and the potential of V_HIGH is minimized.

The circuit 1 mode of operation is continuous with no areas of uncertainty. It has proved capable of providing a fast response to sharp variations in the input conditions.

Absence of cross-conductions and a self-bootstrapped type of operation, from extremely low voltages and with V1 or V2 equaling the voltage drop Vgs of the technology employed, also are to be observed.

Lastly, the circuit according to the invention can also handle situations where:

V1=0, V2>Vgs, or alternatively

V2=0, V1>Vgs.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A low-voltage automatic lock-up biasing circuit comprising:

first and second circuit input terminals for receiving a first and a second potential value, respectively;

a comparator having a first input and a second input connected to the first and second circuit input terminals, respectively;

a level shifter connected between an internal node of the biasing circuit and a reference voltage, the level shifter having an input coupled to an output of the comparator and having a first output and a second output;

first and second enable elements respectively connected between each circuit input terminal and the internal node of the biasing circuit, the enable elements being driven by the respective outputs of the level shifter such that the internal node takes a highest of the potential values of the circuit input terminals.

2. The circuit according to claim 1 wherein the level shifter comprises a double CMOS inverter.

3. The circuit according to claim 1 wherein the enable elements are PMOS pass transistors.

4. The circuit according to claim 2 wherein the double CMOS inverter comprises:

a first complementary pair of transistors connected to the output of the comparator; and a second complementary pair of transistors coupled to the output of the comparator through the first complementary pair of transistors.

5. The circuit according to claim 4 wherein each complementary pair of transistors comprises an NMOS transistor and a PMOS transistor, and wherein an aspect ratio of the width to length of the NMOS transistor in each of the complementary pairs is higher than a corresponding aspect ratio of the PMOS transistors.

6. The circuit according to claim 3 wherein body terminals of each pass transistor are connected directly to the internal node of the biasing circuit, and coupled indirectly via a parasitic component to a respective one of the circuit input terminals.

7. The circuit according to claim 6, wherein the parasitic component is a CMOS well diode structured to be forward biased to a drain terminal of a corresponding one of the pass transistors.

8. A step-up DC/DC converting circuit comprising at least one biasing circuit as claimed in claim 1.

9. An automatic voltage selection circuit comprising:

a first voltage input terminal for accepting a first voltage;

a second voltage input terminal for accepting a second voltage;

a comparator having first and second input terminals respectively coupled to the first and second voltage input terminals, the comparator also having an output terminal;

a first coupling element connected between the first voltage input terminal and an output node of the voltage selection circuit;

a second coupling element connected between the second voltage input terminal and the output node of the voltage selection circuit;

a shifting circuit coupled to the output terminal of the comparator, the shifting circuit having a first output and a second output respectively coupled to the first and second coupling elements; and an inverter having a supply terminal coupled to the output node of the voltage selection circuit and coupled by the first and second coupling elements to the first and second voltage input terminals, respectively, the inverter having a control terminal coupled to the output terminal of the comparator and an output terminal coupled to the shifting circuit.

10. The automatic voltage selection circuit of claim 9 wherein the first and second coupling elements are MOS transistors, each comprising gate, source, drain and body terminals, and wherein the voltage selection circuit further comprises:

a first diode element coupled between the first voltage input terminal and the body terminal of the first coupling element; and a second diode element coupled between the second voltage input terminal and the body terminal of the second coupling element.

11. The automatic voltage selection circuit of claim 10 wherein the first diode element and the second diode element are formed of CMOS well diodes.

12. An automatic voltage selection circuit comprising:

a first voltage input terminal for accepting a first voltage;

a second voltage input terminal for accepting a second voltage;

a comparator having first and second input terminals respectively coupled to the first and second voltage input terminals, the comparator also having an output terminal;

a first coupling element connected between the first voltage input terminal and an output node of the voltage selection circuit;

a second coupling element connected between the second voltage input terminal and the output node of the voltage selection circuit; and a shifting circuit coupled to the output terminal of the comparator, the shifting circuit having a first output and a second output respectively coupled to the first and second coupling elements, wherein the shifting circuit comprises:

a first NMOS transistor having a control terminal, and having a source terminal coupled to a reference voltage, a drain terminal coupled to a drain terminal of a first PMOS transistor, and a source terminal of the first PMOS transistor coupled to the output node of the voltage selection circuit; and a second NMOS transistor having a control terminal, and having a source terminal coupled to the reference voltage, a drain terminal coupled to a drain terminal of a second PMOS transistor, and a source terminal of the second PMOS transistor coupled to the output node of the voltage selection circuit.

13. The automatic voltage selection circuit of claim 12 wherein the first and second NMOS transistors have an aspect ratio larger than the first and second PMOS transistors.

14. The automatic voltage selection circuit of claim 12 wherein the first and second coupling elements are MOS transistors, each comprising gate, source, drain and body terminals, and wherein the gate terminal of the second coupling element and a gate terminal of the first PMOS transistor are coupled to the drain terminals of the second NMOS and second PMOS transistor; and wherein the gate terminal of the first coupling element and a gate terminal of the second PMOS transistor are coupled to the drain terminals of the first NMOS and first PMOS transistor.

* * * * *